(12) United States Patent
Desrochers et al.

(10) Patent No.: US 6,713,797 B1
(45) Date of Patent: Mar. 30, 2004

(54) TEXTURED BI-BASED OXIDE CERAMIC FILMS

(75) Inventors: Debra A. Desrochers, Brookfield, CT (US); Bryan C. Hendrix, Danbury, CT (US); Jeffrey F. Roeder, Brookfield, CT (US); Frank S. Hintermaier, Munich (DE)

(73) Assignees: Advanced Technology Materials, Inc., Danbury, CT (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/197,984

(22) Filed: Nov. 23, 1998

Related U.S. Application Data

(63) Continuation-in-part of application No. 09/107,861, filed on Jun. 30, 1998.

(51) Int. Cl.[7] .......................... H01L 29/76; H01L 29/94; H01L 31/062; H01L 31/119
(52) U.S. Cl. ........................................ 257/295; 257/310
(58) Field of Search ................................ 257/295, 310; 438/3, 240

(56) References Cited

U.S. PATENT DOCUMENTS

| | | | | |
|---|---|---|---|---|
| 5,648,114 A | * | 7/1997 | Paz De Araujo et al. | ........ 438/3 |
| 5,833,745 A | * | 11/1998 | Atsuki et al. | .......... 106/287.18 |
| 5,972,096 A | * | 10/1999 | Sawada et al. | ........ 106/287.18 |

OTHER PUBLICATIONS

"Structure Refinement of Commensurately Modulated Bismuth Strontium Tantalate $Bi_2SrTa_2O_9$," A.D. Rae, J.G. Thompson, R.L. Withers, *Acta Cryst.* B48 (1992) 418–428.

"Layered Structure Oxides for fatigue free Ferroelectric Applications," D.P. Vijay, S.B. Desu, M. Nagata, X.B.Zhang, T.C. Chen, (MRS Symp Proc. vol. 361, 1995) pp. 3–13.

"Oriented growth of $SrBi_2Ta_2O_9$ ferroelectric thin films," S.B. Desu, D.P. Vijay, X. Zhang, B.P. He, *Appl. Phys. Lett.,* 69 (1996) 1719–1721.

"Construction of Bi–system Ferroelectric Artificial Lattices and Their Dielectric Properties," H. Tabata, M. Hamada, T. Kawai, in Proc. 13th Meeting of Ferroelectric materials and Their Applications, Kyoto, May, 1995, pp. 21–22.

"Orientation Control of $Sr^{0.7}Bi_{2.3}Ta_2O_9$ Thin Films by Chemical Process," I. Koiwa, T. Kanehara, J. Mita, T. Iwabuchi, T. Osaka, S. Ono, in Extended Abstracts of the 1996 International Conference on Solid State Devices and Materials, Yokohama, 1996, pp. 628–630.

"Sr Content Dependence of Ferroelectric Properties in $SrBi_2Ta_2O_9$ Thin Films," T. Hase, T. Noguchi, K. Amanuma, Y. Miyasaka, *Integrated Ferroelectrics,* 15 (1997) 127–135.

"Analysis of composition and crystallization temperature dependence of $SrBi_2Ta_2O_9$," T. Noguchi, T. Hase, Y. Miyasaka, in Proc. 13th Meeting of Ferroelectric materials and Their Applications, Kyoto, May, 1995, pp. 37–38.

"Control of epitaxial growth for $SrBi_2Ta_2O_9$ thin films," J.H. Cho, S.H. Bang, J.Y. Son, Q.X. Jia, *Appl. Phys. Lett.* 72 (1998) 665–667.

"Comment on 'Control of epitaxial growth for $SrBi_2Ta_2O_9$ thin films' [Appl. Phys. Lett. 72 (1998) 665]," J. Lettieri, C.I. W D.G. Schlom, preprint submitted to Appl. Phys. Lett.

(List continued on next page.)

*Primary Examiner*—Shouxiang Hu
(74) *Attorney, Agent, or Firm*—Margaret Chappuis

(57) ABSTRACT

A non-volatile memory cell wherein the capacitor comprises a Bi-based metal oxide having a crystallographic texture to produce high switchable polarization.

38 Claims, 6 Drawing Sheets

OTHER PUBLICATIONS

"Epitaxial growth of (001)–oriented and (110)–oriented $SrBi_2Ta_2O_9$ thin films," J. Lettieri, Y. Jia, C.I. Weber, J.P. Maria, Schlom, H. Li, R. Ramesh, R. Uecker, P. Reiche, presented at the 10th Int. Symp. Integrated Ferroelectrics, Monterey, CA (and preprint submitted to Appl. Phys. Lett).

"Analysis of the Dependence of Ferroelectric Properties of Strontium Bismuth Tantalate (SBT) Thin Films on the Compos and Process Temperature", Jpn. J. Appl. Phys. vol. 35 (1996) pp. 4900–4904, Part 1, No. 9B, Sep. 1996.

"Low Temperature Preparation and Characterization of $Sr_xBi_{2+y}Ta_2O_9$/Si Structure for MFOS Memory FET", Y. Matsumu Sugiyama, M. Noda and M. Okuyama, Dept of Physical Science, Osaka Univ., Osaka, Japan.

Watanabe, K., et al., "Spin–coated Ferroelectric SRBI2NB209 Thin Films", Applied Physics Letters, US, American Institute of Physics, New York, vol. 73, No. 1, Jul. 6, 1998, pp. 126–128, XP000771185.

Chae Il Cheon, Jeong Seog Kim, "Crystal Structure, microstructure, and electrical properties in nonstoichiometric SBT thin films" Integrated Ferroelectrics, 1998, Gordon & Breach, Netherlands, vol. 21, No. 1–4, 1998, pp. 229–240, XP000893177, $10^{th}$ International Symposium on Integrated Ferroelectrics, Monterey, CA USA 1–4, Mar. 1998, Fig. 2.

* cited by examiner

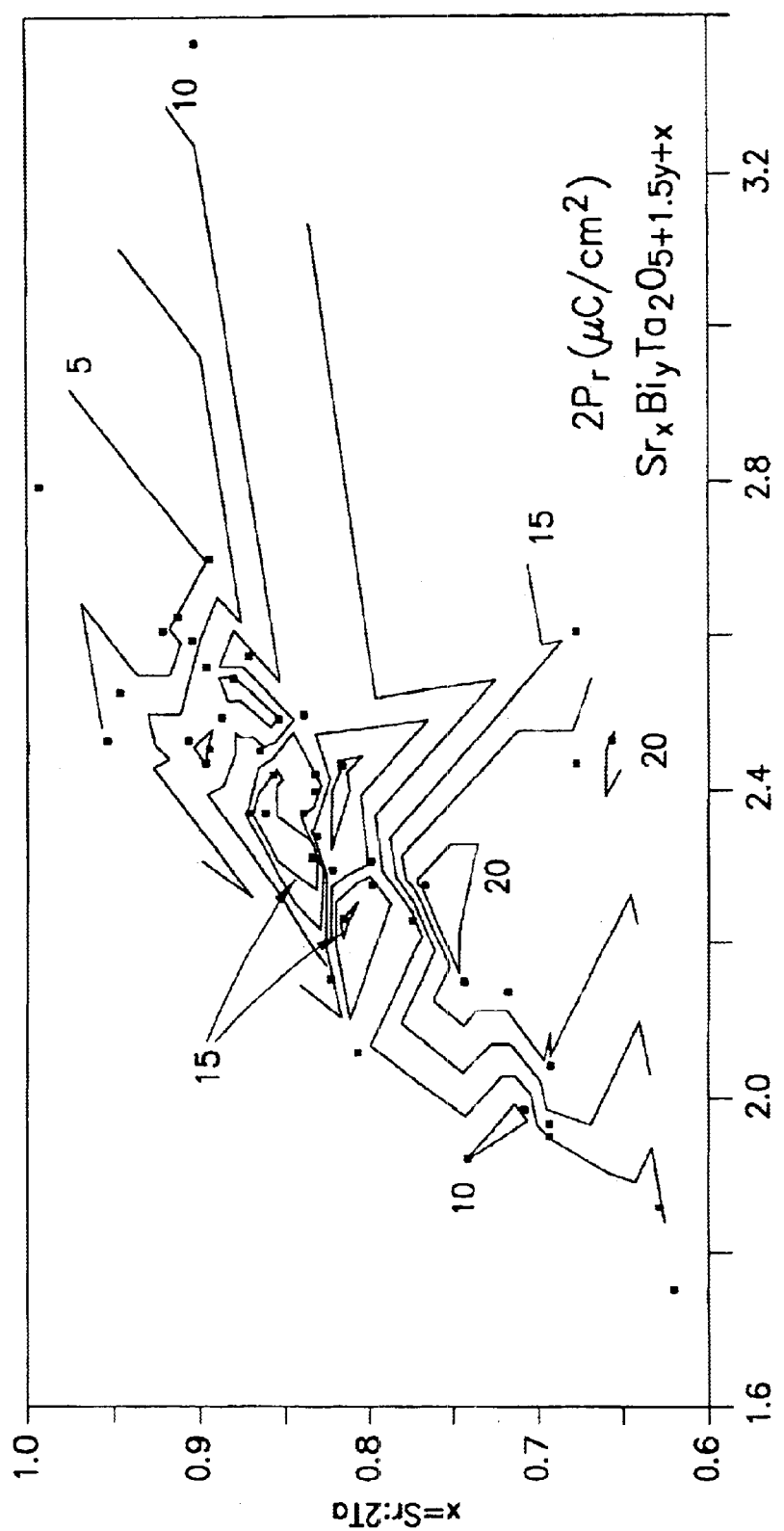

TEXTURED BI-BASED OXIDE CERAMIC FILMS

CROSS-REFERENCE TO RELATED APPLICATION

This is a continuation-in-part of U.S. patent application Ser. No. 09/107,861 filed on Jun. 30, 1998.

FIELD OF THE INVENTION

The invention relates generally to Bi-based metal oxide ceramic films used in integrated circuits (ICs). More particularly, the invention-relates to textured Bi-based metal oxide ceramic films with high switchable electrical polarization.

BACKGROUND OF THE INVENTION

Metal oxide films have been investigated for their use in integrated circuits (ICs). In particular, metal oxide films comprising strontium, bismuth, and tantalum, such as $SrBi_2Ta_2O_9$ (SBT), have attracted considerable attention because of their excellent ferroelectric properties. The ferroelectric properties of SBT make them a promising material for memory capacitors in nonvolatile ferroelectric random access memory ICs. Various techniques, such as sol-gel, chemical vapor deposition (CVD), sputtering, pulsed laser deposition (PLD), and evaporation, have been developed for depositing such films on a substrate.

Fatigue in the ferroelectric material causes degradation in polarization (2Pr). Degradation in polarization is undesirable as it creates reliability issues in the memory IC. For example, degradation in polarization can result in the signal from the stored charge being too small to be unequivocally defined as a logical "0" or "1." To compensate for polarization fatigue, a ferroelectric material with high switchable polarization is needed to increase the reliability of the memory cells.

Other factors also contribute to a need for providing ferroelectric materials with high 2Pr. For example, higher integration densities of devices result in smaller capacitors, necessitating a higher 2Pr value to store the same charge on a smaller capacitor. Also, material degradation due to post-processing can decrease the material's 2Pr value.

From the above discussion, it is desirable to produce a Bi-based metal oxide with high switchable polarization.

SUMMARY OF THE INVENTION

The invention relates to Bi-based metal oxide ceramic layer. In accordance with the invention, the Bi-based metal oxide ceramic layer comprises a crystallographic texture with the correct orientation to result in an increase in the switchable electrical polarization.

In one embodiment, the Bi-based metal oxide ceramic is expressed by $Y_aBi_bX_2O_c$, where Y comprises a 2-valent cation and X comprises a 5-valent cation. In one embodiment, Y is equal to one or more elements selected from Sr, Ba, Pb, and Ca. X, in one embodiment, is equal to one or more elements selected from Ta and Nb. Various techniques, such as sol-gel, chemical vapor deposition (CVD), sputtering, pulsed laser deposition (PLD), and evaporation, can be used to form the Bi-based metal oxide. In one embodiment, the Bi-based metal oxide is deposited amorphously by CVD. The amorphous CVD material is post-deposition processed to transform it into a material with the desired electrical properties.

The amorphous layer is processed to produce a ferroelectric layer in accordance with the invention. The amorphous layer comprises materials that can be transformed into a ferroelectric layer. In one embodiment, the amorphous layer comprises a Bi-based oxide ceramic. The Bi-based oxide ceramic comprises, for example, strontium bismuth tantalate (SBT) or a material derived from SBT (SBT derivative). The amorphous layer is annealed under appropriate conditions transforming it into a ferroelectric layer.

Appropriate control of the composition of the Bi-based oxide can result in a highly textured material. In one embodiment, the composition of the Bi-based oxide is controlled to result in a crystallographic texture of the material having an orientation that produces an increase in the average of the components in the polarization direction perpendicular to a conductive layer.

In one embodiment of the invention, the composition of Bi-based metal oxide comprises a Y/2X ratio of about 0.5–0.9, preferably about 0.6–0.8, and more preferably 0.7–0.8. The ratio of Bi/2X, in one embodiment, is about 2.0–2.6, preferably about 2.1–2.5, and more preferably 2.1–2.3.

In accordance with the invention, the Bi-based oxide ceramic film is deposited substantially in amorphous forms, without substantially any fluorite phase present. Depositing an amorphous Bi-based oxide ceramic film without substantially any fluorite phase contradicts conventional wisdom, which suggests that the fluorite phase is crucial as an intermediate phase from which the deposited film is transformed into a ferroelectric. See for example Isobe et al., Integrated Ferroelectric, 1997,Vol. 14, pp. 95–103. There are several reasons why the fluorite phase is believed to important. It is believed that the fluorite phase serves to transport the as-deposited film up to the reaction temperatures required for the perovskite formation without phase separation, e.g., to prevent separation of the oxides during annealing. Additionally, the pre-arrangement of the atoms in a fluorite phase may facilitate a fast film transformation to the Aurivillius phase.

We have discovered that depositing an amorphous Bi-based oxide ceramic film without substantially any fluorite phase is advantageous. For example the amorphous film requires a lower thermal budget than conventional as-deposited films to transform it into the ferroelectric phase. Furthermore, ferroelectrics formed from amorphous films have better electrical characteristics than those formed from conventional techniques.

It is believed that the reason a lower thermal budget is needed to transform the amorphous precursor film into the ferroelectric phase is because amorphous films are more compositionally homogeneous than the fluorite-containing as-deposited films. Heterogeneous films such as the fluorite containing films require more time and higher temperature anneals because some atoms in these film have to move over longer distances. Other detrimental phases might be formed during the longer high temperature anneal in parts of the films with the wrong composition.

In contrast to the conventional as-deposited films, the substantially amorphous as-deposited film is relatively smooth with smaller or no features. The relatively smooth surface indicates that there is reduced Bi segregation during deposition, which produces a film that is more homogeneous in composition than conventional as-deposited films with fluorite phase. The surface morphology of XRD amorphous films is smooth with no or almost no features, indicating that the film is homogeneous in composition.

The amorphous nature of the Bi-based oxide ceramic film is affected by the deposition temperature. The Bi-based oxide ceramic is deposited at a temperature, which produces a substantially amorphous film. In one embodiment, the deposition temperature is lower than 400° C., more preferably at about 330–390° C., more preferably at about 350–390° C., more preferably at about 360–380° C., more preferably at about 380° C. At temperatures less than 430° C., a substantially amorphous film is produced. It has been found, in one embodiment, that an XRD amorphous film is produced when deposited at temperatures of about 380° C. or less.

The ferro-anneal transforms the amorphous film into a ferroelectric. A ferro-anneal at a temperature of about 600–830° C. for about 1–60 minutes, depending on the temperature, has been found to be sufficient to convert the amorphously deposited film to the ferroelectric Aurivillius phase. The higher the temperature of the anneal, the shorter the time required to transform the substantially amorphous film to the Aurivillius ferroelectric phase. For example, an anneal of about 5 minutes at 750° C. is sufficient to complete the transformation to the Aurivillius phase. A slightly longer anneal of about 10 minutes is sufficient to complete the transformation to the Aurivillius phase at about 700° C.

BRIEF DESCRIPTION OF THE DRAWINGS

FIG. 7 shows the correlation between switchable polarization (2Pr) with respect to composition.

DETAILED DESCRIPTION OF THE INVENTION

The invention relates to Bi-based metal oxide ceramic films and their applications in ICs. More particularly, the invention relates to Bi-based metal oxide ceramics comprising a crystallographic texture controlled by its composition.

In accordance with one embodiment of the invention, a Bi-based metal oxide film is deposited on a substrate. Various techniques, such as sol-gel, chemical vapor deposition (CVD), sputtering, pulsed laser deposition (PLD), and evaporation can be used to deposit the Bi-based metal oxide film. Preferably, the Bi-based metal oxide is deposited by CVD. More preferably, the Bi-based metal oxide is deposited amorphously by CVD. Typically, a post-deposition heat treatment such as an anneal is performed to transform the Bi-based oxide into a ferroelectric material. The post-deposition heat treatment produces a highly textured Bi-based oxide ceramic.

For purposes of illustration, the invention is described in the context of a ferroelectric memory cell and a ferroelectric transistor. However, the invention is applicable to the formation of Bi-based metal oxide ceramics with high switchable polarization in general. Other applications such as a transistor comprising a Bi-based metal oxide layer are also useful. Ferroelectric transistors are described in, for example, Miller and McWhorter, "Physics of ferroelectric non-volatile memory field effect transistor," J. Appl. Physics, 73(12), p 5999–6010 (1992); and co-pending U.S. patent application Ser. No. 09/107,861, titled "Amorphously Deposited Metal Oxide Ceramic Films," which are herein incorporated by reference for all purposes.

Figure 1:
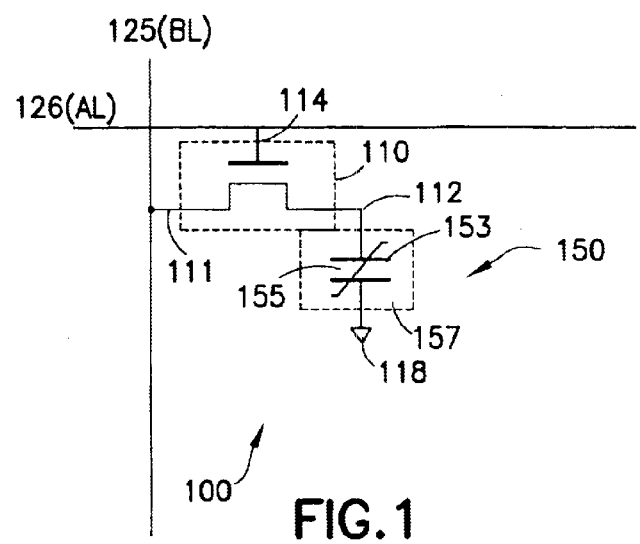
FIG. 1 shows a ferroelectric memory cell in accordance with one embodiment of the invention.

Referring to FIG. 1, a schematic diagram of a ferroelectric memory cell 100 in accordance with one embodiment of the invention is shown. As shown, the memory cell comprises a transistor 110 and a ferroelectric capacitor 150. A first electrode 111 of the transistor is coupled to the bitline 125 and a second electrode 112 is coupled to the capacitor. A gate electrode of the transistor is coupled to the wordline 126.

The ferroelectric capacitor comprises first and second plates 153 and 157 separated by a Bi-based ferroelectric layer. The first plate 153 is coupled to the second electrode of the transistor. The second plate typically serves as a common plate in the memory array.

In accordance with the invention, the Bi-based ferroelectric layer comprises a crystallographic texture controlled by its composition. Providing a correctly oriented crystallographic texture in Bi-based metal oxide ferroelectric layer results in a high switchable polarization.

Typically a plurality of memory cells is interconnected with wordlines and bitlines to form an array in a memory IC. Access to the memory cell is achieved by providing the appropriate voltages to the wordline and bitline, enabling data to be written or read from the capacitor.

Figure 2:
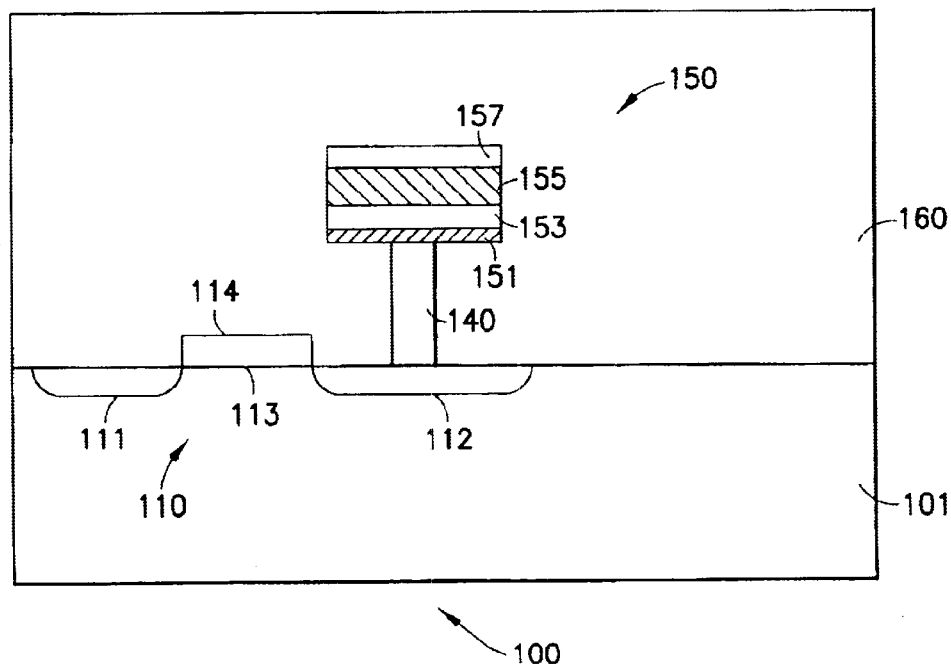
FIG. 2 shows a metal oxide field effect transistor comprising a ferroelectric layer in accordance with one embodiment of the invention.

Referring to FIG. 2, a cross-section of an illustrative ferroelectric memory cell 100 in accordance with one embodiment of the invention is shown. The memory cell comprises a transistor 110 formed on a substrate 101 such as a semiconductor wafer. The transistor includes diffusion regions 111 and 112 separated by a channel 113, above which is located a gate 114. A gate oxide (not shown) separates the gate from the channel. The diffusion regions comprise dopants which are p-type or n-type. The type of dopants chosen is dependent upon the type of transistor desired. For example, n-type dopants such as arsenic (As) or phosphorus (P) are used for n-channel devices, and p-type dopants such as boron (B) are used for p-channel devices. Depending on the direction of current flow between the diffusion regions, one is referred to as the "drain" and the other the "source." The terms "drain" and "source" are herein used interchangeably to refer to the diffusion regions. Typically, the current flows from the source to drain. The gate represents a wordline, and one of the diffusion regions 111 is coupled to a bitline by a contact plug (not shown).

A capacitor 150 is coupled to diffusion region 112 via a contact plug 140. The capacitor comprises bottom and top electrodes 153 and 157 separated by a ferroelectric layer 155. A highly textured ferroelectric layer is provided. The crystallographic texture is controlled by the composition of the ferroelectric layer. The electrodes are typically formed from noble metal such as, for example, Pt. A conductive barrier layer 151 can be provided between the bottom electrode and contact plug. The barrier layer inhibits the diffusion of oxygen into the contact plug 140. The barrier layer also inhibits 1) the diffusion of atoms from the plug into the ferroelectric layer, and 2) the migration of atoms from the bottom electrode or ferroelectric layer into the plug.

An interlevel dielectric (ILD) layer 160 is provided to isolate the different components of the memory cell. The ILD layer comprises, for example, silicate glass such as silicon dioxide ($SiO_2$) or silicon nitride ($Si_3N_4$) Doped silicate glass such as borophosphosilicate glass (BPSG), borosilicate glass (BSG), or phosphosilicate glass (PSG) are also useful. Other types of dielectric materials can also be used.

The memory cell 100 is formed by a process sequence that includes forming the transistor 110 on the substrate. The substrate, for example, is a semiconductor wafer comprising silicon. Other types of substrates such as germanium (Ge), gallium arsenide (GaAs), or other semiconductor compounds can also be used. Typically, the substrate is lightly doped with p-type dopants such as B. More heavily doped substrates are also useful. A heavily doped substrate with a lightly doped epitaxial (epi) layer such as a p−/p+ substrate can also be used. N-type doped substrates, including lightly doped, heavily doped, or heavily doped substrates with a lightly doped epi layer, are also useful.

A doped well comprising dopants, if necessary, is provided to prevent punchthrough. The doped well is formed by selectively implanting dopants into the substrate in the region where the transistor is formed. A photoresist mask layer can be used for selectively implanting the dopants. In one embodiment, the doped well is formed by implanting p-type dopants such as B into the substrate. The p-type doped well (p-well) serves as a doped well for n-channel devices. The use of an n-type doped well (n-well) comprising, for example, As or P dopants is also useful for p-channel devices.

Diffusion regions 111 and 112 are formed by selectively implanting dopants having a second electrical type into the desired portions of the substrate. In one embodiment, n-type dopants are implanted into the p-type well used for n-channel devices and p-type dopants are used for p-channel devices. An implant may also be performed to implant dopants into the channel region between the diffusion regions to adjust the gate threshold voltage ($V_T$) of the transistor. Forming the diffusion regions after gate formation is also useful.

Various layers are deposited on the substrate and patterned to form the gate. The gate, for example, include gate oxide and polycrystalline silicon (poly) layers. The poly is, for example, doped. In some cases, a metal silicide layer is formed over the doped poly, producing a polysilicon-silicide (polycide) layer to reduce sheet resistance. Various metal silicides, including molybdenum ($MoSi_x$), tantalum ($TaSi_x$), tungsten ($WSi_x$), titanium silicide ($TiSi_x$) or cobalt silicide ($CoSi_x$), are useful. Aluminum or refractory metals, such as tungsten and molybdenum, can be used alone or in combination with silicides or poly.

Contact plugs and bitline can be formed after completion of the transistor using various known techniques such as, for example single or dual damascene techniques Reactive ion etch (RIE) techniques are also useful. A combination of damascene and etch techniques can also be used. The contact plugs comprise a conductive material such as doped poly or tungsten (W). Other conductive materials are also useful. The bitline, for example, comprises aluminum (Al) or other types of conductive materials. An ILD layer 160 isolates the different components of the memory cell.

To prevent or reduce migration of atoms between the contact plug 140 and the subsequently formed ferroelectric layer, a conductive barrier layer 151 over the ILD layer. The barrier layer comprises, for example, titanium nitride (TiN). Other materials such as $IrSi_xO_y$, $CeO_2/TiSi_2$, or $TaSiN_x$ are also useful.

The process continues by forming the ferroelectric capacitor 150. A conductive layer 153 is deposited over the barrier layer. The conductive layer 153 serves as the bottom electrode. The bottom electrode comprises a conductive material. Preferably, the conductive material does not react with the subsequently deposited metal oxide ceramic film. In one embodiment, the bottom electrode comprises a noble metal such as Pt, Pd, Au, Ir, or Rh. Other materials such as conducting metal oxides, conducting metal nitrides, or super conducting oxides are also useful. Preferably, the conducting metal oxides, conducting metal nitrides, or super conducting oxides do not react with the ferroelectric layer. Conducting oxides include, for example, $IrO_x$, $RhO_x$, $RuO_x$, $OsO_x$, $ReO_x$, or $WO_x$ (where x is greater than about 0 and less than about 2). Conducting metal nitrides include, for example, $TiN_x$, $ZrN_x$ (where x is greater than about 0 and less than about 1.1), $WN_x$, or $TaN_x$ (where x is greater than about 0 and less than about 1.7). Super conducting oxides can include, for example, $YBa_2Cu_2O_{7-x}$ or $Bi_2Sr_2Ca_2CU_2O_{10}$.

The conductive and barrier layers are patterned to form a bottom electrode.

A Bi-based metal oxide layer 155 is formed over the conductive layer 153. In accordance with the invention, the resulting Bi-based oxide layer comprises a crystallographic texture which produces a high switchable polarization. Various techniques, such as such as sol-gel, chemical vapor deposition (CVD), sputtering, pulsed laser deposition (PLD), and evaporation, are used to form the Bi-based metal oxide. Preferably, the Bi-based metal oxide is formed by CVD. In one embodiment, The Bi-based oxide is deposited by low temperature CVD techniques. Low temperature techniques are described in co-pending U.S. Ser. No. 08/975,087, titled "Low Temperature CVD Process using B-Diketonate Bismuth Precursor for the Preparation of Bismuth Ceramic Thin Films for Integration into Ferroelectric Memory Devices," which is herein incorporated by reference for all purposes. Depositing the Bi-based oxide amorphously by CVD is also useful. CVD Amorphously deposited Bi-based oxide layers are described in co-pending U.S. patent application Ser. No. 09/107,861, titled "Amorphously Deposited Metal Oxide Ceramic Films" (attorney docket number 98P7422), which is herein incorporated by reference for all purposes.

In one embodiment, the Bi-based metal oxide layer is generally expressed by $Y_aBi_bX_2O_c$, where Y comprises a 2-valent cation and X comprises a 5-valent cation. In one embodiment, Y is equal to one or more elements selected from Sr, Ba, Pb, and Ca. X, in one embodiment, is equal to one or more elements selected from Ta and Nb. The subscript "a" refers to the number of Y atoms for every 2X atoms; subscript "b" refers to the number of Bi atoms for every 2X atoms; and subscript "c" refers to the number of oxygen atoms for every 2X atoms.

In one embodiment, the Bi-based oxide ceramic comprises Sr. A Bi-based oxide comprising Sr and Ta is also useful. Preferably, the Bi-oxide comprises $Sr_aBi_bTa_2O_c$. Derivatives of SBT are also useful. SBT derivatives include $Sr_aBi_bTa_{2-x}Nb_xO_c$ (0<x<2), $Sr_aBi_bNb_2O_c$, $Sr_{a-x}Ba_xBi_bTa_{2-y}Nb_yO_c$ ($0 \leq x \leq 1$, $0 \leq y \leq 2$), $Sr_{a-x}Ca_xBi_2Ta_{2-y}Nb_yO_9$ ($0 \leq x \leq 1$, $0 \leq y \leq 2$), $Sr_{a-x}Pb_xBi_2Ta_{2-y}Nb_yO_c$ ($0 \leq x \leq 1$, $0 \leq y \leq 2$), or $Sr_{a-x-y-z}Ba_xCa_yPb_zBi_bTa_{2-p}Nb_pO_c$ ($0 \leq x \leq a$, $0 \leq y \leq a$, $0 \leq z \leq a$, $0 \leq p \leq 2$). Substituting or doping the Bi-based oxides or SBT derivatives with a metal of the lanthanide series is also useful.

Precursors and reactive gases employed to form the Bi-based oxide ceramic are described in co-pending U.S. patent application Ser. No. 08/975,087, titled "Low Temperature CVD Process using B-Diketonate Bismuth Precursor for the Preparation of Bismuth Ceramic Thin Films for Integration into Ferroelectric Memory Devices," which was filed on Nov. 20, 1997; and co-pending U.S. patent application Ser. No. 08/960,915, titled "Anhydrous Mononuclear Tris(Beta-Diketonate) Bismuth Compositions and Method of Making the Same," which was filed on Oct. 30, 1997, and which are all herein incorporated by reference for all purposes.

In one embodiment, the Bi precursor of the Bi-based oxide ceramic comprises Bi(β-diketonate). Preferably, the Bi precursor comprises Bi(thd)$_3$. Bi alcoxides, Bi carboxylates, Bi amides, and Bi aryls are also useful Bi precursors. In one embodiment, the Bi aryl precursor comprises BiPh$_3$.

The Sr precursor of the Bi-based oxide ceramic comprises, for example, Sr(β-diketonate). In one embodiment, the Sr precursor comprises Sr(thd)$_2$. Sr(thd)$_2$ (adduct) such as Sr(thd)$_2$(pentamethyldiethylenetriamine) or Sr(thd)$_2$(tetraglyme) is especially useful.

The Ta precursor of the Bi-based oxide ceramic comprises, for example, Ta(β-diketonate). Ta alcoxides are especially useful Ta precursors. In one embodiment, the Ta precursor comprises Ta(β-diketonate) alcoxides such as Ta(thd)$_x$(OR)$_{5-x}$. A Ta precursor such as Ta(thd)(O—i—Pr)$_4$ is also useful.

In another embodiment, the SBT or SBT-derived film is formed with Bi(thd)$_3$, Sr(thd)$_2$ pentamethyldiethylenetriamine adduct, and Ta (O—i—Pr)$_4$(thd) precursors. Other precursors for the deposition of the Bi-based oxides are also useful.

The precursors can be individually dissolved in a solvent system and stored in a respective reservoir of the delivery subsystem. The precursors are mixed in the correct ratio prior to deposition. Mixing the precursors in a single reservoir is also useful. The precursors should be highly soluble in the solvent system. The solubility of the precursors in the solvent system is, for example, about 0.1–5M. Solubility of about 0.1–2M or about 0.1–1M is also useful.

The Bi-based metal oxide layer is annealed under appropriate conditions, transforming it into a ferroelectric material. Typically, the anneal is performed at a temperature of about 500–850° C. Annealing the metal oxide layer at a temperature of about 600–800° C., 650–750° C., 600–700° C., or 650–700° C. is also useful. The temperature of the anneal can vary depending on the nature of the deposited film. For example, amorphously deposited films can be annealed at a relatively lower temperature. The anneal transforms the metal oxide layer into a highly textured ferroelectric material.

A conductive layer 157 is deposited over the ferroelectric layer to form the top electrode. The conductive layer comprises, for example, noble metal such as Pt, Pd, Au, Ir, or Rh. Other materials such as those used to form the bottom electrode are also useful. The top electrode typically serves as a common electrode, connecting other capacitors in the memory array. The top electrode is patterned as necessary to provide contact openings to the bitlines and wordlines. Another post-deposition heat treatment can be performed after the formation of the conductive layer.

Additional processing is performed to complete the ferroelectric memory IC. Such additional processing is known in the art. For example, the additional processing includes forming support circuitry, contact openings to the bitline, final passivation layer, contact openings in the passivation layer for testing and connecting to lead frame, and packaging.

In accordance with the invention, a Bi-based metal oxide comprising a crystallographic texture which produces a high switchable polarization is provided. The crystallographic texture of the Bi-based metal oxide layer affects the switchable polarization. By orienting the crystallographic texture of the Bi-based metal oxide in the correct direction can increase the switchable polarization.

The amount of polarization that can be switched is related to the cosine of the angle between the direction of the polarization vector in the ferroelectric crystal and the direction of the field applied by the device to switch the polarization. In the case of a parallel plate capacitor, the switching field is applied to the ferroelectric in the direction perpendicular to the conductive top and bottom electrodes. In the case of the ferroelectric transistor, the switching field is applied to the ferroelectric layer in a direction perpendicular to the conductive top or gate electrode. The maximum switchable polarization is obtained when the polarization vector of the ferroelectric crystal is aligned with the applied field as the cosine of 0° gives the maximum value of the cosine, namely, 1.

Figure 3:
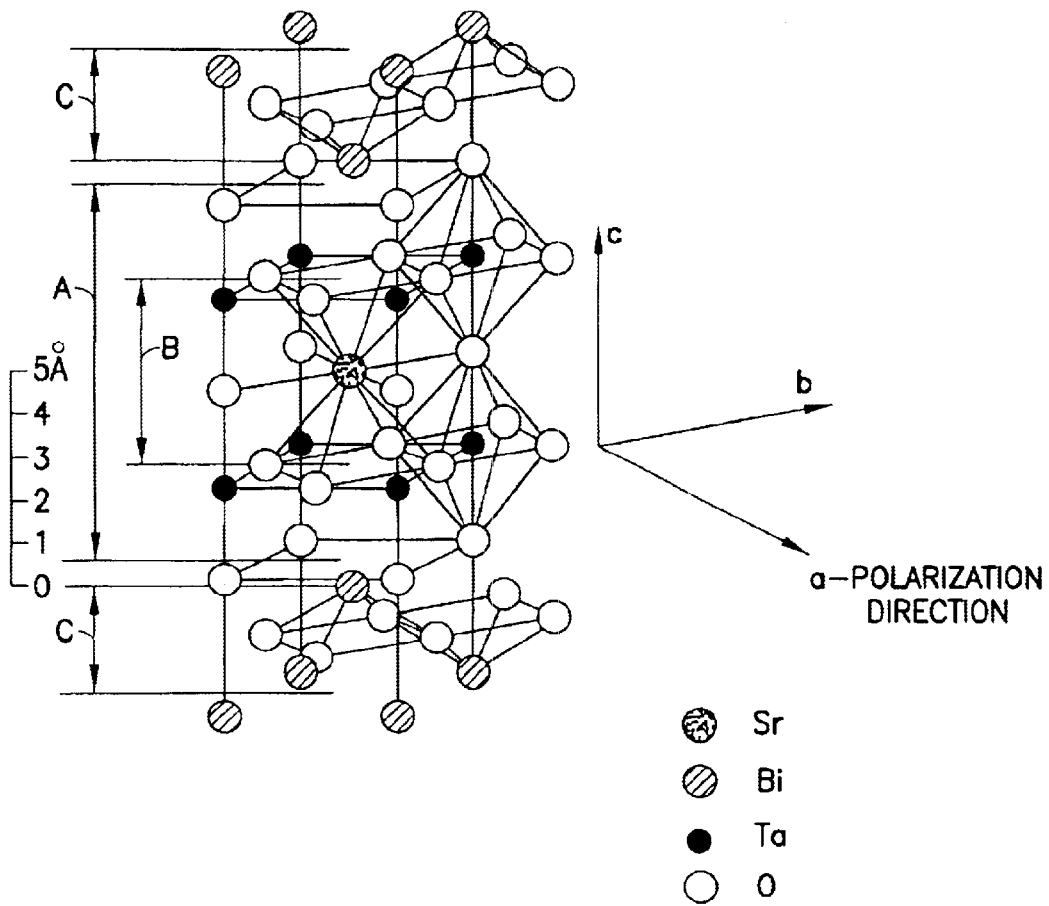
FIG. 3 shows a layered perovskite structure of the ferroelectric SBT.

Referring to FIG. 3, a layered perovskite structure 300 of the ferroelectric SBT is shown. The SBT is expressed by, for example, the formula SrBi$_2$Ta$_2$O$_9$. The Aurivillius phase of the SBT film comprises negatively charged perovskite layers of Sr and Ta oxide 305 separated by positively charged Bi oxide layers 310. The stoichiometry of the Sr and Ta oxide is for example $[SrTa_2O_7]^{2n-n}$, and the stoichiometry of the Bi oxide layers is for example $[Bi_2O_2]^{2n+n}$, creating a structure of alternating $[SrTa_2O_7]^{2n-n}$ and $[Bi_2O_2]^{2n+n}$ layers.

As shown in FIG. 3, the polarization direction of the SBT is along the a-axis. The b-axis represents a potential polarization direction. The a-axis and b-axis can be interchanged by, for example, a diffusionless transformation between 90° domains of the ferroelectric material. The transformation (poling) occurs with the application of an electric field.

The c-axis, on the other hand, is perpendicular to the Bi-oxide layers of the structure. In this direction, little to no switchable polarization can be induced. Accordingly, only crystals of SBT that have a component of the a-axis and/or b-axis in the direction of the field applied by the device for switching will contribute to the switchable polarization.

In accordance with one embodiment of the invention, a Bi-based metal oxide layer comprising a crystallographic texture that produces an increase in the average of the components of the a-axis and/or b-axis of the crystal lattice (i.e., in the direction of the field applied by the device for switching) is provided. Increasing the average of the components of the a-axis and/or b-axis of the crystal lattice in the direction of the field applied by the device for switching increases the switchable polarization of the device incorporating the Bi-based metal oxide. Preferably, the Bi-based metal oxide ceramic comprises a crystallographic texture that maximizes the average of the components of the polarization direction in the direction of the field applied by the device for switching.

We have discovered that the stoichiometry or composition of the Bi-based metal oxide layer affects the crystallographic texture of the layer.

In one embodiment of the invention, the composition of the Bi-based metal oxide layer is controlled to produce a crystallographic texture that increases the average of the components of the polarization directions in the direction of the field applied by the device for switching. Preferably, the crystallographic texture of the Bi-based metal oxide comprises an orientation that maximizes the average of the components of the polarization directions in the direction of the field applied by the device for switching. In one embodiment, the crystallographic texture results in an increase in the average of the a-axis and/or b-axis direction in the direction of the field applied by the device for switching.

In one embodiment of the invention, the Bi-based metal oxide layer expressed by $Y_aBi_bX_2O_c$. The composition of the $Y_aBi_bX_2O_c$ layer is controlled to produce a crystallographic texture that increases the average of the polarization components (which is in the a-axis and/or b-axis direction) in the direction of the field applied by the device for switching. Preferably, the composition of the $Y_aBi_bX_2O_c$ layer is controlled to produce a crystallographic texture that maximizes the average of the polarization components (which is in the a-axis and/or b-axis direction) in the direction of the field applied by the device for switching.

In one embodiment, the composition of $Y_aBi_bX_2O_c$ comprises a Y/2X ratio of about 0.5–0.9, preferably about 0.6–0.8, and more preferably 0.7–0.8. The Bi/2X ratio of the Bi-based metal oxide, in one embodiment, is about 2.0–2.6, preferably about 2.1–2.5, and more preferably 2.1–2.3.

In a preferred embodiment, the composition of the Bi-based metal oxide comprising SBT comprises a Sr/2Ta ratio of about 0.5–0.9, preferably about 0.6–0.8, and more preferably 0.7–0.8. The Bi/2Ta ratio of the SBT, in one embodiment, is about 2.0–2.6, preferably about 2.1–2.5, and more preferably 2.1–2.3.

Decreasing the Sr or Y content of the Bi-based metal oxide produces an increase in the average of the a-axis and/or b-axis in the direction perpendicular to the conductive layer or plates of the capacitor. This result is contrary to conventional teachings. Conventional teachings suggest that decreasing the Sr content of SBT causes an increase in the unpolarizable c-axis orientation. See Hase et al., Sr Content Dependence of Ferroelectric Properties in $SrBi_2Ta_2O_9$ Thin Films," Integrated Ferroelectrics, vol 15, p127–135 (1997).

Experiments

Numerous SBT films with different compositions were formed on prepared substrates. The substrates included a 625 nm thick layer of thermal silicon oxide with a 10 nm thick Ti layer deposited on the oxide by sputtering at about 450° C. A bottom electrode comprising about 100 nm thick of Pt was formed over the Ti by sputtering at about 190° C.

The SBT films were deposited over the Pt electrode. The precursors employed to form the SBT films were $Sr(thd)_2$, $Bi(thd)_3$, and $Ta(thd)(O—I—Pr)_4$. The SBT films were deposited amorphously at a temperature of about 380° C. and a pressure of about 9 torr in an ambient of 60%$O_2$:40%Ar. The gas flow rate was either 1.6 slm or 10 slm for different films. Films were grown to thickness from 150 nm to 200 nm. The deposited SBT films were annealed for about 1 hour in flowing $O_2$ at about 800° C. Pt was e-beam evaporated through a shadow mask to form top electrodes. A second anneal was performed for about 15 minutes in flowing $O_2$ at 800° C.

The SBT films were analyzed to determine the relationship among orientation, composition, and electrical characteristics. Electrical testing was performed in a Radiant RT6000 ferroelectric tester. Composition was measured over 8 mm diameter areas in a Rigaku 3613 X-ray fluorescence spectrometer using Rigaku's "fundamental parameters" method and standards of MOD films. Texture was estimated from the intensity of different peaks in a symmetric theta-2theta (Bragg-Brantano) geometry in a Rigaku D/maxB goniometer with a curved monochrometer and a Cu X-ray target. The divergent slit was 1°, the receiving slit was 0.3°, and the receiving slit for the monochrometer was 0.6°.

Figure 4:
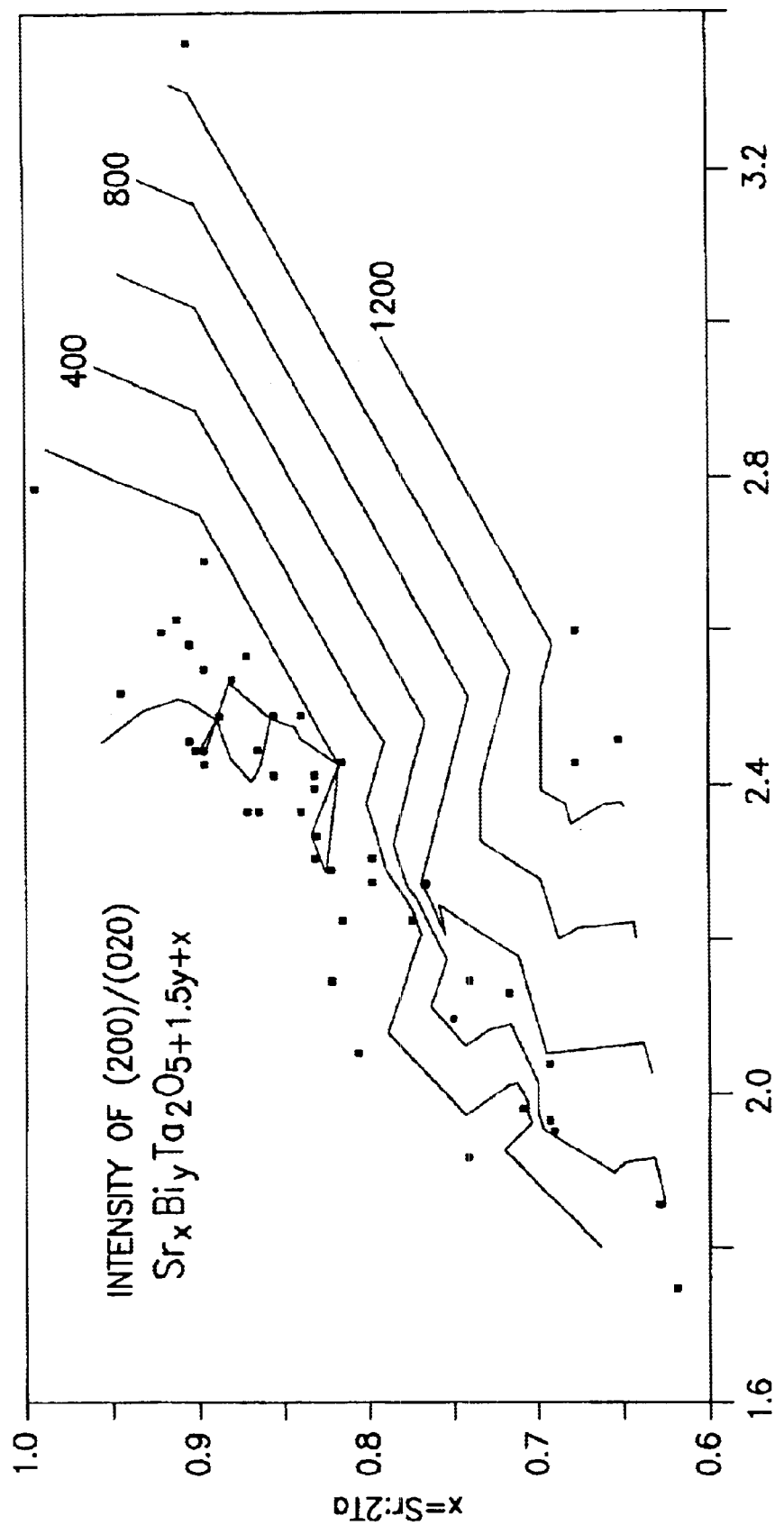
FIGS. 4–6 show the texture of the Bi-based oxide as a function of composition.

FIG. 4 shows the intensity of the (200)/(020) peak as a function of composition. The dots indicate the composition of the films that were measured and the contour lines indicate the interpolated intensity as a function of composition. The (200) peak corresponds to the a-axis and the (020) peak corresponds to the b-axis. The (200) and (020) orientations cannot be distinguished in this measurement because their lattice parameters are very close. As the ratio of Sr/2Ta decreases and the Bi/2Ta ratio increases, a (200) orientation is preferred.

Figure 5:
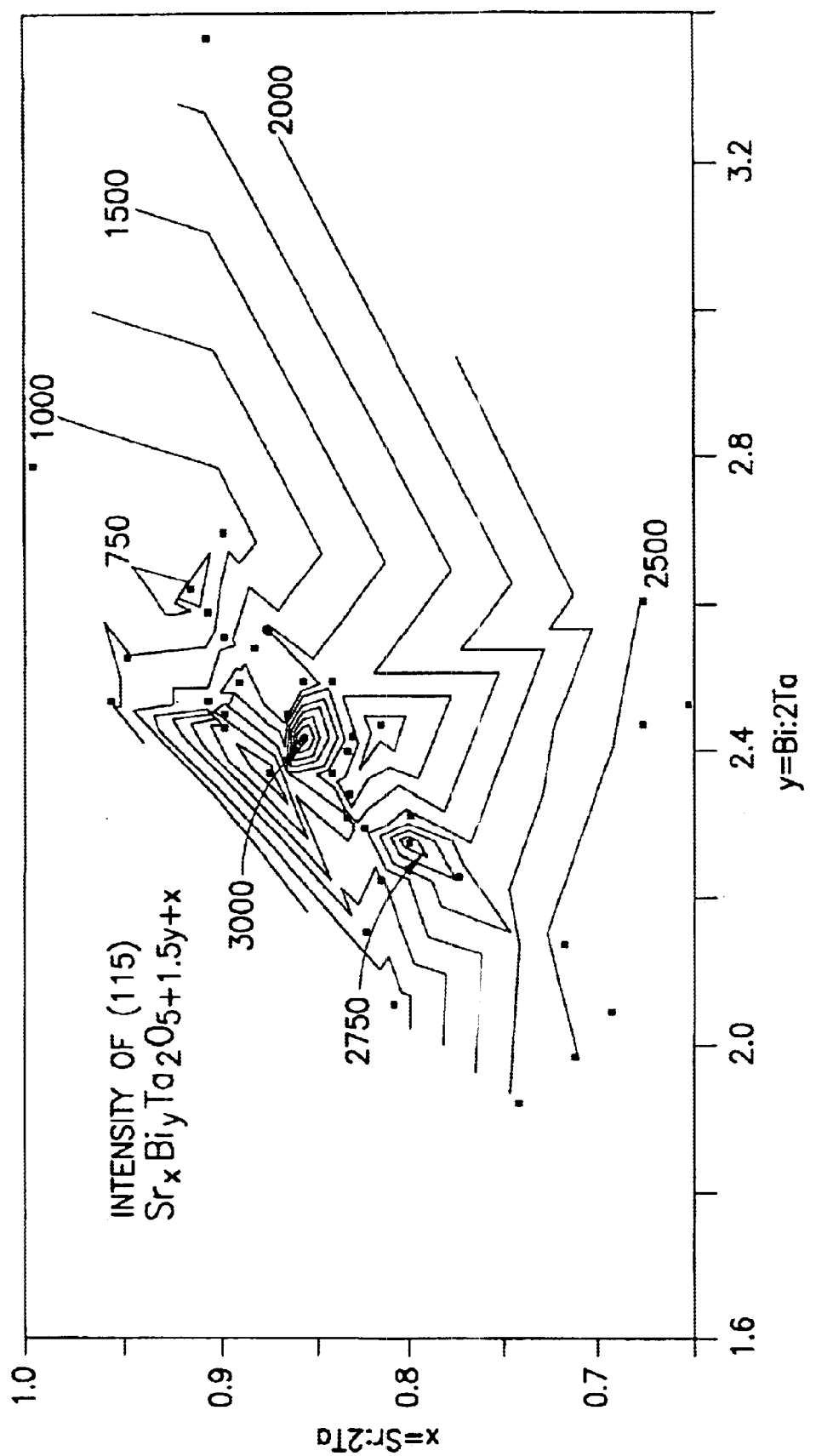

FIG. 5 shows the intensity of the (115) peak as a function of composition. The dots indicate the composition of the films that were measured and the contour lines indicate the interpolated intensity as a function of composition. The (115) peak corresponds to components from the a-axis and b-axis. Lower ratios of Sr/2Ta and intermediate Bi/2Ta enhance the preference for (115) orientation.

Figure 6:
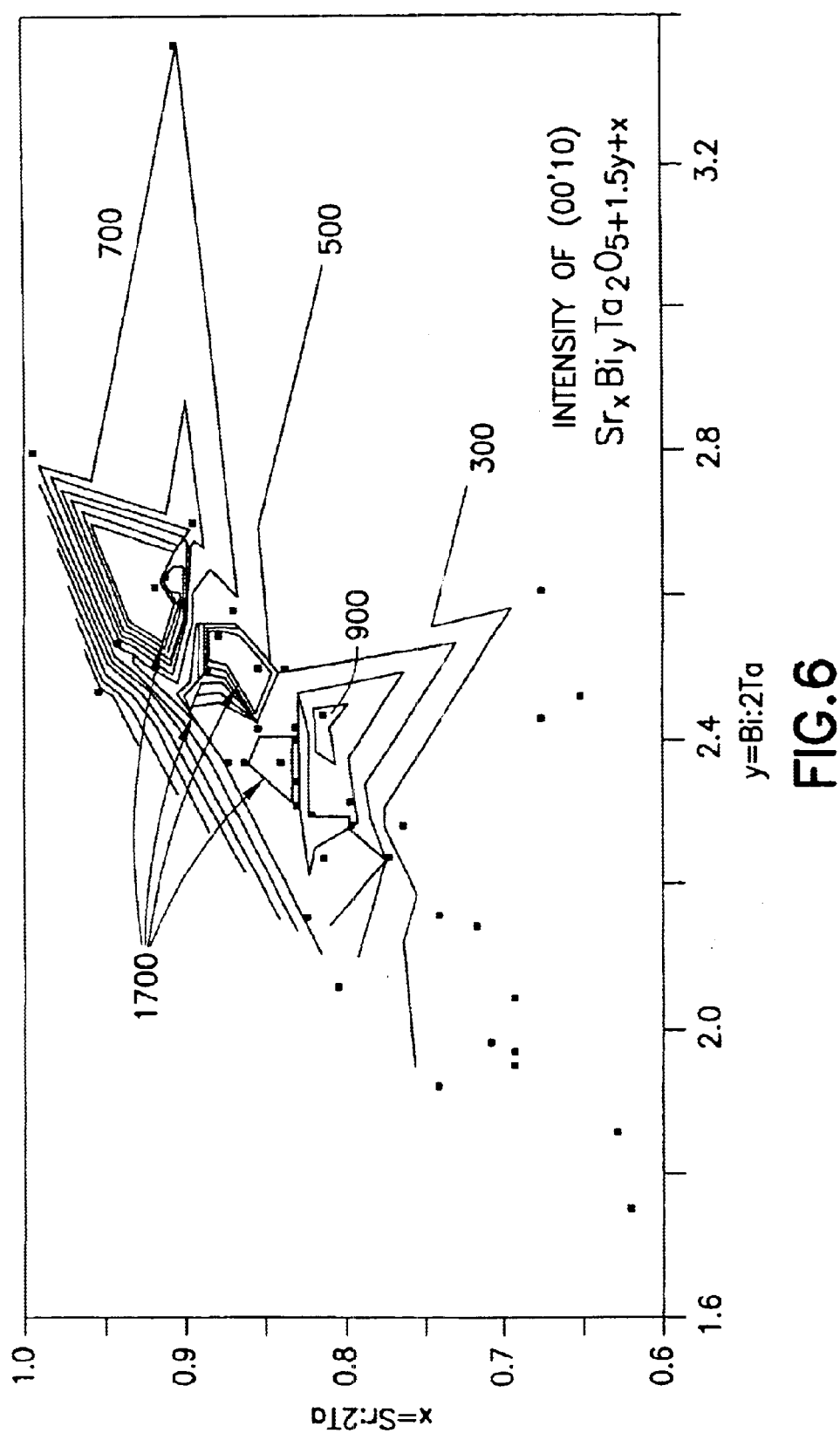

FIG. 6 shows the intensity of the (00'10) peak as a function of composition. The dots indicate the composition of the films that were measured and the contour lines indicate the interpolated intensity as a function of composition. The (00'10) peak corresponds to the c-axis. As can be seen, a lower Sr/2Ta ratio decreases the preference for the (00'10) orientation.

From FIGS. 4–6, it can be seen that the amount of a-axis texture and b-axis texture can be increased almost to the exclusion of measurable c-axis material. As the (00'10) texture is reduced and the a-axis and b-axis increased, the switchable polarization increases. This demonstrates the relationship between the polarization direction of the crystals and the plates of the capacitor. Furthermore, FIGS. 4–6 show that the texture of the film is affected by the composition of the film. As Sr is decreased from the stoichiometric composition of 1.00 to 0.75–0.80, the (00'10) peak decreases and the (115) and (200) peaks increase relative to one another. With the Sr/2Ta ratio in the range of about 0.65–0.80 and increasing the Bi/2Ta ratio from about 2.0 to 2.3, the intensity of the (200) peak increases with the (00'10) remaining minimal.

FIG. 7 shows the correlation between switchable polarization (2Pr) with respect to composition. It can be seen that switchable polarization increases as the ratio of Sr/2Ta decreases to below 0.75 at a Bi/2Ta from about 2.0 to 2.5.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A ferroelectric device comprising:
   a conductive layer; and
   a Bi-based ferroelectric layer electrically contacting the conductive layer,
   said Bi-based ferroelectric layer having a 2Pr value of between 15 and 20 and being formed by chemical vapor depositing at a temperature that is between about 280° C. and a temperature less than 400° C., a substantially amorphous ceramic layer having a composition $Y_aBi_bX_2O_c$; and annealing the substantially amorphous ceramic layer,
   wherein Y of the ceramic layer composition represents a 2-valent cation in less than a stoichiometric amount and X of the ceramic layer composition represents a 5-valent cation.

2. The ferroelectric device of claim 1, wherein the substantially amorphous ceramic layer is annealed at a temperature between about 600° C. to about 830° C. for about 1 to 60 minutes.

3. The ferroelectric device of claim 1, wherein the subscript a of the $Y_aBi_bX_2O_c$ composition is about 0.5–0.9.

4. The ferroelectric device of claim 1, wherein the subscript b of the $Y_aBi_bX_2O_c$ composition is about 2.0–2.6.

5. The ferroelectric device of claim 1, wherein the subscript a of the $Y_aBi_bX_2O_c$, composition is about 0.6–0.8.

6. The ferroeletric device of claim 1, wherein the subscript b of the $Y_aBi_bX_2O_c$, composition is about 2.1–2.5.

7. The ferroelectric device of claim 1, wherein the subscript a of the $Y_aBi_bX_2O_c$, composition is about 0.7–0.8.

8. The feroelectric device of claim 1, wherein the subscript b of the $Y_aBi_bX_2O_c$, composition is about 2.1–2.3.

9. The ferroelectric device of claim 1, wherein the substantially amorphous ceramic layer is substantially free of fluorite phase.

10. The ferroelectric device of claim 1, wherein the substantially amorphous ceramic layer is deposited from organometallic precursors comprising $Bi(thd)_3$.

11. The ferroelectric device of claim 10 wherein the organometallic precursors are dissolved in a solvent system comprising octane:decane:pentamethyldiethylenetriamine in a 5:4:1 volumetric ratio.

12. The ferroelectric device of claim 1, wherein the substantially amorphous ceramic layer is deposited at a temperature of about 380° C.

13. The ferroelectric device of claim 1, wherein the substantially amorphous ceramic layer is deposited at a deposition pressure between about 0.1 and about 760 Torr.

14. The ferroelectric device of claim 1, wherein the substantially amorphous ceramic layer is deposited at a deposition pressure between about 8 and about 10 Torr.

15. The ferroelectric device of claim 1, wherein the substantially amorphous ceramic layer is annealed by a multi-step annealing process, comprising:

annealing said substantially amorphous ceramic layer at a first temperature for a first duration; and subsequently annealing said substantially amorphous ceramic layer at a second temperature for a second duration, wherein the first temperature is higher than the second temperature, and the first duration is shorter than the second duration.

16. The ferroelectric device of claim 1, wherein Y and X of the of the ceramic layer composition $Y_aBi_bX_2O_c$ are Sr and Ta respectively.

17. The ferroelectric device of claim 16, wherein the subscript a is about 0.5–0.9.

18. The ferroelectric device of claim 17, wherein the subscript b is about 2.0–2.6.

19. The ferroelectric device of claim 16, wherein the subscript a is about 0.6–0.8.

20. The ferroelectric device of claim 19, wherein the subscript b is about 2.1–2.5.

21. The ferroelectric device of claim 16, wherein the subscript a is about 0.7–0.8.

22. The ferroelectric device of claim 21, wherein the subscript a is about 2.1–2.3.

23. The ferroelectric device of claim 1, wherein the Bi-based ferroelectric layer comprises an SBT derivative.

24. The ferroelectric device of claim 1, wherein:

Y is equal to one or more elements selected from the group consisting of Sr, Ba, Pb, and Ca; and X is equal to one or more elements selected from the group consisting of Ta and Nb.

25. The ferroelectric device of claim 1, wherein the a subscript is about 0.5–0.9, the b subscript is about 2.0–2.6 and the c subscript is equal to the number of oxygen atoms.

26. The ferroelectric device of claim 1, wherein the Bi-based ferroelectric layer comprises a crystallographic texture, having a, b and c crystal lattice components.

27. The ferroelectric device of claim 26 having a polarization direction perpendicular to the conductive layer.

28. The ferroelectric device of claim 26, wherein the crystallographic texture, is controlled by the composition of the Bi-based ferroelectric layer.

29. The ferroelectric device of claim 28, wherein the crystallographic texture is measured by average a, b and c crystal lattice components.

30. The ferroelectric device of claim 28, wherein said a and b crystal lattice components are polarizable in an electric field by an interchangeable and diffusionless transformation.

31. The ferroelectric device of claim 30, having a polarization direction along the a component of the crystal lattice.

32. The ferroelectric device of claim 30, having a polarization direction along the b component of the crystal lattice.

33. The ferroelectric device of claim 30, wherein the electric field is perpendicular to the Bi-based ferroelectric layer.

34. The ferroelectric device of claim 33, wherein the a and b crystal lattice components are polarizable in a direction perpendicular to the Bi-based ferroclectric layer.

35. The ferroelectric device of claim 34, wherein only the a and b crystal lattice components contribute to the polarizability of the device.

36. The ferroelectric device of claim 34, wherein said a and b crystal lattice components are interchangeable between 90° domains in the presence of an electric field.

37. The ferroelectric device of claim 34, wherein the crystallographic texture of the Bi-based ferroelectric layer is oriented to maximize the average of the a and b components of the polarization direction.

38. A ferroelectric device comprising:

a conductive layer; and a Bi-based ferroelectric layer having a 2Pr of between 15 and 20, electrically contacting the conductive layer, wherein said Bi-based ferroelectric layer comprises an SBT derivative formed by depositing a Bi-based oxide ceramic layer in substantially amorphous form by chemical vapor deposition at a temperature that is between 280° C. and temperature less than 400° C., and annealing the substantially amorphous Bi-based oxide ceratnic layer, wherein the Bi-based oxide cerarnic layer is selected from the group comprising $Sr_aBi_bTa_{2-x}Nb_xO_c$ ($0<x<2$), $Sr_aBi_bNb_2O_c$, $Sr_{a-x}Bi_bTa_{2-y}Nb_yO_c$ ($0 \leq x \leq a$, $0 \leq y \leq 2$), $Sr_{a-x}Ca_xBi_bTa_{2-y}Nb_yO_c$ ($0 \geq x \geq a$, $0 \geq y \geq 2$), $Sr_{a-x}Pb_xBi_bTa_{2-y}Nb_yO_c$ ($0 \geq x \geq a$, $z0 \geq y \geq 2$), or $Sr_{a-x-y-z}Ba_xCa_yPb_zBi_bTa_{2-p}Nb_pO_c$ ($0 \leq x \leq a$, $0 \leq y \leq a$, $0 \leq z \leq a$, $0 \leq p \leq 2$), wherein the subscript a in said Bi-based oxide ceremic is less 1.

* * * * *